June 20, 1972 | AKIHIRO FUJII | 3,671,338

METHOD OF MANUFACTURING A SEMICONDUCTOR PHOTO-SENSITIVE DEVICE

Filed Dec. 5, 1969

AKIHIRO FUJII
INVENTOR.

BY
Attys

United States Patent Office 3,671,338

Patented June 20, 1972

3,671,338

METHOD OF MANUFACTURING A SEMICONDUCTOR PHOTO-SENSITIVE DEVICE

Akihiro Fujii, Yokohama-shi, Japan, assignor to Tokyo Shibaura Electric Co., Ltd., Kawasaki-shi, Japan Filed Dec. 5, 1969, Ser. No. 882,679
Claims priority, application Japan, Dec. 9, 1968, 43/89,594
Int. Cl. H01l 7/36, 5/00; C23c 13/00
U.S. Cl. 148—175 12 Claims

ABSTRACT OF THE DISCLOSURE

A method of manufacturing a semiconductor photo-sensitive device includes the steps of forming a poly crystal formation layer on the flat surface of an N-type semiconductor substrate excluding the peripheral edge thereof, depositing a crystal layer on the surface including a poly crystal region overlaying the poly crystal formation layer, forming a plurality of PN junctions in the opposite surface of the substrate, and removing the poly crystal region, thereby forming a recess structure substrate.

Figure 1A:
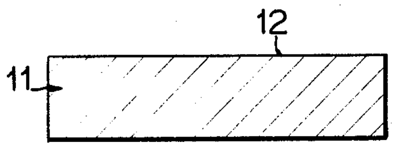

This invention relates to a method of manufacturing semiconductor photo-sensitive devices, and more particularly to a method of manufacturing an array type target.

A target or device of this nature is commonly known to have a construction of either a PN junction diode type or a transistor type. In either case, various properties, particularly the photoelectric sensitivity and a resolution, are known to be superior to those of a target formed of photosensitive material. Such a target is used, for example, in a vidicon.

A prior art target, for example, of the PN junction type, is typically formed in the following manner. A plurality of mutually spaced P-condutivity type layers are formed by a selective diffusion process on one surface of an N-conductivity type silicon substrate having a thickness of about 150$\mu$, a beam being impinged upon said surface of the substrate. The opposite surface of the substrate, except the peripheral edge thereof, is so etched that the substrate has a thickness of about 25$\mu$ to define a concave surface. Upon such etched surface is generally formed, although not necessarily an $N^+$-conductivity type layer which acts to accelerate the movement of minority carriers or holes formed by the light projected on said surface. The provision of a thin portion in the central part of the substrate is to improve the receiving properties for the visible light range of the target, and formation of the thick peripheral edge is to assure mechanical strength of the substrate. Both are necessary factors in fabricating a target of this nature.

The above-mentioned conventional method, however, involves certain problems. When the light receiving surface of the substrate is to be subjected to an etching treatment excepting the peripheral edge thereof, it is required that the etched surface be optically as plain as possible. It is very difficult, using the mirror finishing process or the chemical etching process normally practised in the art, to form the concave surface of said substrate to have a required flat plane. It may be added that thermal distortion is produced in the body of the substrate which partly is very thin as described above, due to the heat used when said $N^+$-conductivity type layer is formed by diffusion.

The object of the present invention is to provide a method of manufacturing a semiconductor photo-sensitive device or target having a substrate of a concave configuration as described above, in which the concave surface of the substrate can be formed to be flatter than that formed in accordance with the prior art technique.

SUMMARY OF THE INVENTION

The method of the present invention comprises the steps of depositing a "poly crystal formation layer" on one surface of a semiconductor substrate of predetermined thickness excluding peripheral edge portion of said surface, forming a crystal layer on the surface of the substrate including a portion defined by the poly crystal formation layer, the crystal layer including a (which includes a poly crystal region directly overlaying the poly crystal formation layer), polishing and/or etching the surface of the substrate opposite the crystal layer to a predetermined thickness while utilizing the crystal layer as reinforcement, forming in the etched surface a plurality of spaced regions having a conductivity type opposite to that of the substrate, and removing the poly crystal region overlaying the poly crystal formation layer.

When a low resistivity layer of the same conductivity type is to be formed in the substrate, an impurity having the same conductivity type as the substrate should first be doped in said poly crystal formation layer, so that the impurity may be diffused into the substrate at the time of a heat treatment for forming said plurality of spaced regions. The term "poly crystal formation layer" is intended to mean a layer which will have a poly crystal structure when it is overlayed directly by a crystal layer to be formed by deposition, and to include, for example, a silicon oxide film, silicon nitride film, or an alumina layer. This poly crystal formation layer may either be removed simultaneously with the removal of the poly crystal region, or allowed to remain if it is of such a nature as will not intercept a light injected thereto. The part of said crystal layer which is directly superposed on the peripheral edge of said substrate may be so formed as to have a poly or single crystal structure.

This invention can be more fully understood from the following detailed description when taken with reference to the accompanying drawing, in which:

FIGS. 1A to 1G are cross sectional views to explain the steps of manufacturing a photo-sensitive device in accordance with one embodiment of this invention.

Figure 1E:
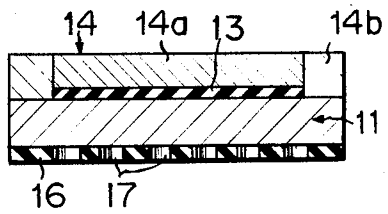
Figure 1B:
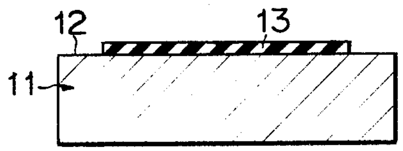
Figure 1F:
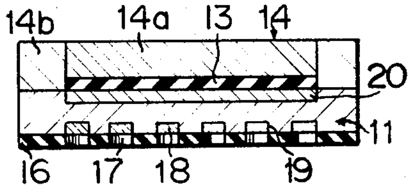
Figure 1C:
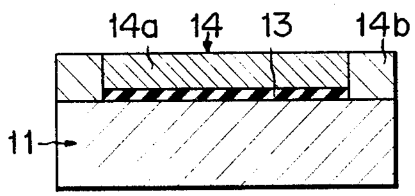
Figure 1G:
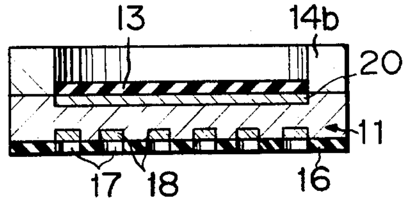
Figure 1D:
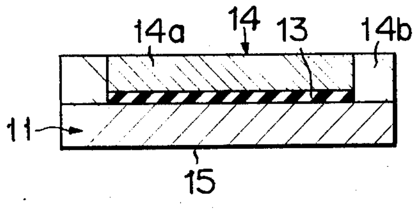

An N-conductivity type silicon substrate 11 having a resistivity of about 10Ω-cm. and a thickness of about 150 to 200$\mu$ is first prepared. One surface 12 of the substrate is mirror polished by a well known process (FIG. 1A). Upon that portion of said surface 12 which excludes the peripheral edge thereof, viz a portion of the device effecting photo-electrical conversion, is formed a silicon dioxide film 13 in which phosphorus is doped, said film 13 serving as the "poly crystal formation layer." The film 13 is deposited, for example, by heating the substrate 11 to about 1100° to 1200° C. in an oxygen atmosphere containing phosphor (FIG. 1B). On the surface 12 of the substrate 11 including a portion defined by the film 13 is epitaxially grown a silicon crystal layer 14 by thermal decomposition of monosilane. It is preferred that the crystal layer 14 has the same conductivity as the substrate 11, namely an N-type conductivity. The crystal layer 14 has a poly crystal structure at a portion 14a overlaying the silicondioxide film 13 and a single crystal structure 14b at a portion directly overlaying the surface of the substrate 11 (FIG. 1C). The opposite surface 15 of the substrate 11 is subjected to usual mirror polishing so that the substrate 11 has a predetermined thickness, say 20$\mu$. In the mirror polishing treatment, the crystal layer 14 functions as a reinforcement for the substrate. Usually, mirror polishing creates difficulty when the substrate is thin. According to this invention, such treatment can be effectively accomplished since the provision of the reinforcing crystal layer 14 substantially increases the effective thickness of the substrate. On the polished surface 15 is formed, by a well known method, a silicon dioxide film 16 in which a plurality of openings 17 having predetermined spacings are formed by selective etching (FIG. 1E). The film 16 is utilized as a mask and a plurality of island-shaped P-conductivity type regions 18 are formed in the surface 15 of the substrate by diffusion of boron at about 1100° C., with the result that P-N junctions 19 are formed between the substrate 11 and each of the island-shaped regions 18. Simultaneously with the formation of the island-shaped regions 18 by said heat treatment, the phosphorus doped in said "poly crystal formation layer" is diffused into the body of the substrate to form an $N^+$-conductivity type layer 20 in the substrate surface 12 (FIG. 1F). The poly crystal region 14a of the crystal layer 14 formed by the process described in connection with FIG. 1C is then removed by chemical etching, and subsequently the silicon dioxide film 13 defining the poly crystal formation layer is similarly removed, thus causing the substrate to have a concave configuration (FIG. 1G). The above etching treatments may be carried out in such a manner that the poly crystal region 14a only is first treated, for example, by such an etchant as will corrode the silicon semiconductor material but will not corrode the silicon dioxide film, viz a mixture consisting of HF, $HNO_3$ and $CH_3COOH$ in the ratio of 5:1:4 by volume, and that the silicon dioxide film is then treated by an etchant which readily causes silicon oxide to be etched, such as fluorine. Since the silicon dioxide film 13 permits an injecting light to pass therethrough provided that the thickness thereof is kept below a predetermined limit, it is preferred that the film 13 is retained for the purpose of producing an effect of avoiding reflection of light. Various processes can be employed for removing the poly crystal region. For example, a so-called selective etching process may be used to etch only the poly crystal region after the formation of a mask on the other region. Further, the poly crystal region and the single crystal region may be simultaneously subjected to etching using an etchant having a different etching speed for the poly crystal structure and the single crystal structure, such as an etchant of acetyl nitrate and hydrofluoric acid.

When the formation of the $N^+$-conductivity type layer is not required, a semiconductor device may equally be produced by the aforesaid processes, provided that no N-conductivity type impurity is incorporated into the poly crystal formation layer.

According to this invention, the finishing of one surface of the substrate or a side at which light is projected, which is generally mirror finished in the initial stage of treatment can be deferred until the last stage, so that the light projecting surface of the device can define a more flat plain surface than a prior art device. Further, since the substrate is mechanically supported by the crystal layer at the time of formation of the P-conductivity type region, occurrence of distortion of the substrate due to the high temperatures generated at the time of forming said region can be eliminated.

Although N-conductivity type silicon is used as the substrate in the foregoing embodiment, P-conductivity type silicon may also be used for this purpose, provided that the island-shaped regions are of N-conductivity type. In addition to silicon, gallium arsenide, germanium or the like may be used as the semiconductor substance. It should be understood that the method of this invention is applicable not only to the manufacture of a diode type device but also to transistor type devices.

What is claimed is:

1. A method of manufacturing a semiconductor photosensitive device comprising the steps of:
- preparing a semiconductor substrate of one conductivity type, one surface of said substrate being planar;
- forming a poly crystal formation layer on said planar surface of the substrate excluding the peripheral edge portion of said planar surface;
- forming a crystal layer on said planar surface of the substrate including a portion defined by said poly crystal formation layer, said crystal layer including a poly crystal region overlaying said poly crystal formation layer;
- reducing the thickness of the substrate by removing substrate material from the surface of the substrate opposite said planar surface;
- forming a plurality of spaced PN junctions in said opposite surface; and
- removing said polycrystal region of said crystal layer after reducing the thickness of the substrate.

2. The method according to claim 1 wherein said crystal layer is formed to include a single crystal region on the peripheral edge of said surface of the substrate.

3. The method of claim 1 further comprising removing said poly crystal formation layer after the step of removing said poly crystal region.

4. The method according to claim 1 in which said step of forming said poly crystal formation layer comprises forming a silicon oxide film by thermal decomposition of a silicon compound.

5. The method according to claim 1 in which said crystal layer is made of the same material and has the same conductivity type as said substrate.

6. A method of manufacturing a semiconductor photosensitive device comprising the steps of:
- preparing a semiconductor substrate of one conductivity type, one surface of said substrate being planar;
- forming a poly crystal formation layer on said planar surface of the substrate except on the peripheral edge of said planar surface, said poly crystal formation layer containing an impurity of the same conductivity type as that of the substrate;
- forming a crystal layer on said planar surface of the substrate including a portion defined by said poly crystal formation layer, said crystal layer including a poly crystal region overlaying said poly crystal formation layer;
- reducing the thickness of the substrate by removing substrate material from the surface of the substrate opposite said planar surface;
- forming a plurality of spaced PN junctions in said opposite surface by thermal diffusion;
- forming a layer on said planar surface by diffusing said impurity contained in said poly crystal formation layer into said planar surface of the substrate by thermal diffusion, said layer having the same conductivity type as the substrate and having a higher impurity concentration than the substrate; and
- removing said poly crystal region of said crystal layer after reducing the thickness of the substrate.

7. The method according to claim 6 wherein said crystal layer is formed to include a single crystal region on the peripheral edge of said surface of the substrate.

8. The method of claim 6 further comprising removing said poly crystal formation layer after the step of removing said poly crystal region.

9. The method according to claim 6 in which said step of forming said poly crystal formation layer comprises forming a silicon oxide film by thermal decomposition of a silicon compound.

10. The method according to claim 6 in which said crystal layer is made of the same material and has the same conductivity type as said substrate.

11. The method according to claim 1 wherein the thickness of said substrate is reduced by scraping said surface of said substrate opposite said planar surface.

12. The method according to claim 6 wherein the thickness of said substrate is reduced by scraping said surface of said substrate opposite said planar surface.

References Cited

UNITED STATES PATENTS

| | | | |
|---|---|---|---|
| 3,403,278 | 9/1968 | Kahng et al. | 317—235 N |
| 3,372,063 | 3/1968 | Suzuki | 148—1.5 |
| 3,478,213 | 11/1969 | Simon et al. | 317—235 N |
| 3,403,284 | 9/1968 | Buck et al. | 317—235 N |
| 3,458,782 | 7/1969 | Buck et al. | 317—235 N |
| 3,475,661 | 10/1969 | Iwata et al. | 317—234 |
| 3,537,919 | 11/1970 | Bittmann | 148—175 |

L. DEWAYNE RUTLEDGE, Primary Examiner

W. G. SABA, Assistant Examiner

U.S. Cl. X.R.

29—576, 580; 117—106 A, 201, 212; 148—174; 156—17; 313—65; 317—234 R